(12) United States Patent
Barsukov et al.

(10) Patent No.: US 10,739,765 B2
(45) Date of Patent: Aug. 11, 2020

(54) METHOD FOR ENRICHING DATA IN MEASUREMENT DATA RECORDS OF A LOW-VOLTAGE NETWORK

(71) Applicant: Siemens AG Oesterreich, Vienna (AT)

(72) Inventors: Yaroslav Barsukov, Vienna (AT); Ralf Mosshammer, Vienna (AT)

(73) Assignee: Siemens AG Österreich, Vienna (AT)

( * ) Notice: Subject to any disclaimer, the term of this patent is extended or adjusted under 35 U.S.C. 154(b) by 357 days.

(21) Appl. No.: 15/524,804

(22) PCT Filed: Oct. 15, 2015

(86) PCT No.: PCT/EP2015/073832
§ 371 (c)(1),
(2) Date: May 5, 2017

(87) PCT Pub. No.: WO2016/071087
PCT Pub. Date: May 12, 2016

(65) Prior Publication Data
US 2018/0307217 A1 Oct. 25, 2018

(30) Foreign Application Priority Data
Nov. 6, 2014 (DE) .................. 10 2014 222 662

(51) Int. Cl.
*G05B 23/02* (2006.01)
*G06F 16/35* (2019.01)
(Continued)

(52) U.S. Cl.
CPC ....... *G05B 23/024* (2013.01); *G01R 19/2513* (2013.01); *G01R 31/086* (2013.01);
(Continued)

(58) Field of Classification Search
CPC .............. G01R 19/2513; G01R 31/086; G05B 23/024; G05B 19/042; G05B 23/0235;
(Continued)

(56) References Cited

U.S. PATENT DOCUMENTS

2010/0061272 A1* 3/2010 Veillette .................. H04L 45/34
370/254
2010/0278187 A1* 11/2010 Hart ........................ H04L 45/00
370/401
(Continued)

FOREIGN PATENT DOCUMENTS

DE 10 2013 206 946 A1 10/2014
GB 2 488 164 A 8/2012
(Continued)

OTHER PUBLICATIONS

Francisco de León et al, "Development of Data Translators for Interfacing Power-Flow Programs With EMTP-Type Programs: Challenges and Lessons Learned", IEEE Transactions on Power Delivery, vol. 28, No. 2, Apr. 2013 (Year: 2013).*
(Continued)

*Primary Examiner* — Regis J Betsch
(74) *Attorney, Agent, or Firm* — Cozen O'Connor

(57) ABSTRACT

A method for enriching data in measurement data records of a low-voltage network, wherein a measurement data record contains at least one measured value and an item of structureless information relating to the network node from which the data record comes, such that meanings can be at least partially assigned to measurement data without the assistance of people, where arriving measurement data records, in particular asynchronously arriving measurement data records, from a plurality of network nodes is stored in a data memory in a time sequence for each network node, time sequences are subjected to a mathematical analysis via automatic data processing, and the result of the analysis is
(Continued)

added to a measurement data record as at least one semantic comment.

14 Claims, 2 Drawing Sheets

(51) Int. Cl.
    *G06Q 10/06*     (2012.01)
    *G06Q 50/06*     (2012.01)
    *G05B 19/042*     (2006.01)
    *G01R 19/25*     (2006.01)
    *G06F 40/30*     (2020.01)
    *G01R 31/08*     (2020.01)

(52) U.S. Cl.
    CPC ....... *G05B 19/042* (2013.01); *G05B 23/0235* (2013.01); *G06F 16/35* (2019.01); *G06F 40/30* (2020.01); *G06Q 10/06* (2013.01); *G06Q 50/06* (2013.01)

(58) Field of Classification Search
    CPC ..... G06F 16/35; G06F 17/2785; G06Q 10/06; G06Q 50/06
    See application file for complete search history.

(56) References Cited

U.S. PATENT DOCUMENTS

| | | |
|---|---|---|
| 2011/0035187 A1 | 2/2011 | Dejori et al. |
| 2012/0016608 A1 | 1/2012 | Ko et al. |
| 2012/0126793 A1* | 5/2012 | Loy .................. G01R 11/04 324/142 |
| 2012/0143383 A1* | 6/2012 | Cooperrider ............ H02J 3/383 700/295 |
| 2012/0197560 A1 | 8/2012 | Kuhns et al. |
| 2012/0278272 A1 | 11/2012 | Kim et al. |
| 2014/0012524 A1 | 1/2014 | Flammer, III |
| 2014/0214218 A1 | 7/2014 | Eldridge et al. |

FOREIGN PATENT DOCUMENTS

| | | |
|---|---|---|
| WO | WO 2008/092513 A1 | 8/2008 |
| WO | WO 2011/128883 A2 | 10/2011 |
| WO | WO 2013/149899 A1 | 10/2013 |
| WO | WO 2014/090969 A2 | 6/2014 |

OTHER PUBLICATIONS

Maarten Altorf, "Data mining on grids", Universiteit Leiden, Aug. 2007 (Year: 2007).*

Vijay Vittal et al., "Data Mining to Characterize Signatures of Impending System Events or Performance from PMU Measurements", Power Systems Engineering Research Center, PSERC Publication 13-39, Aug. 2013 (Year: 2013).*

* cited by examiner

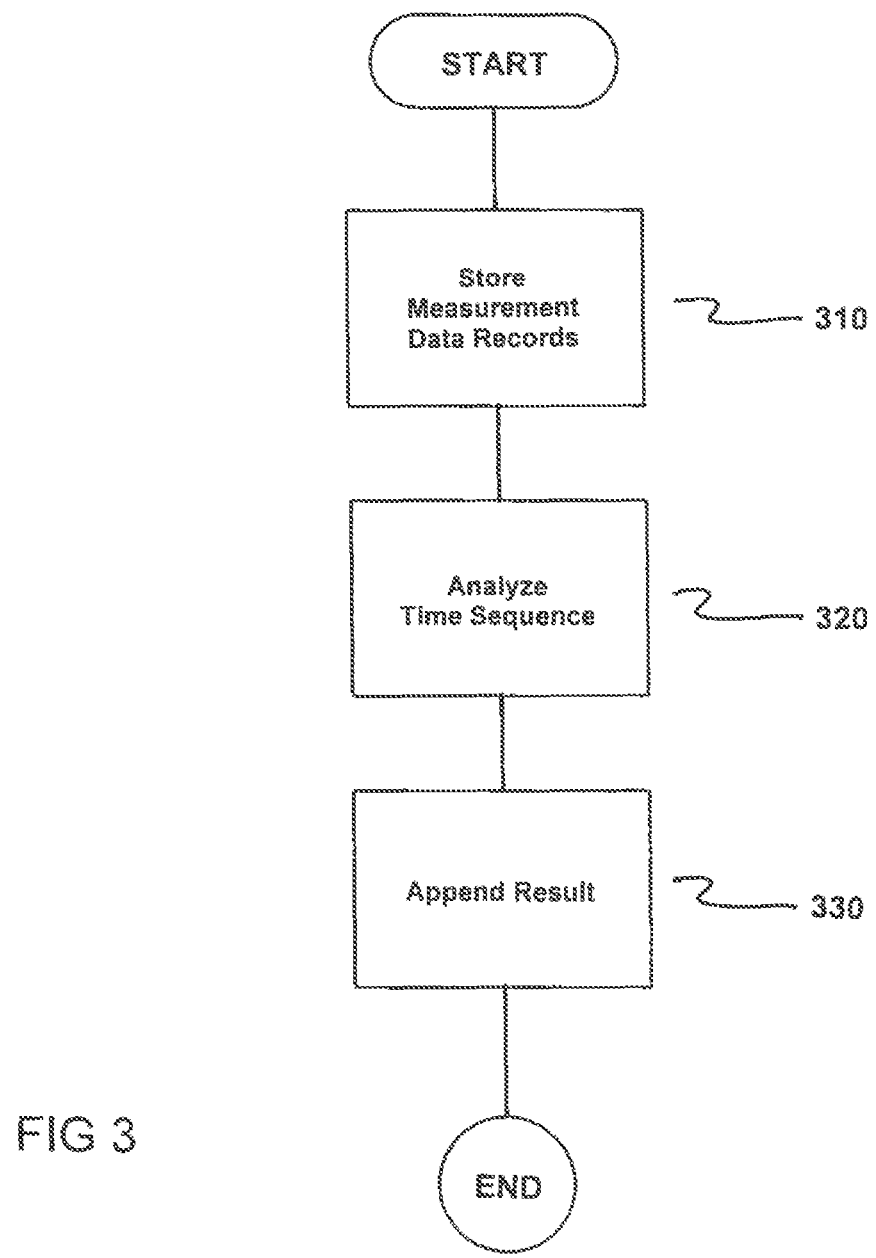

METHOD FOR ENRICHING DATA IN MEASUREMENT DATA RECORDS OF A LOW-VOLTAGE NETWORK

CROSS-REFERENCE TO RELATED APPLICATIONS

This is a U.S. national stage of application No. PCT/EP2015/073832 filed 15 Oct. 2015. Priority is claimed on German Application No. 102014222662.7 filed 6 Nov. 2014, the content of which is incorporated herein by reference in its entirety.

BACKGROUND OF THE INVENTION

1. Field of the Invention

The present invention relates to a method for enriching data in measurement data records of a low-voltage network, where a measurement data record contains at least one measured value and an item of structureless information relating to the network node from which the data record originates.

2. Description of the Related Art

Low-voltage networks are part of the electricity supply network established to distribute electrical energy to the vast majority of electricity-consuming end loads, which consist of low-voltage devices. In order to avoid voltage losses, low-voltage networks are limited in terms of their spatial extent to a range of a few 100 m up to just a few kilometers. Low-voltage networks are therefore fed regionally via transformer stations from a higher-level medium-voltage network. In Europe, low-voltage networks are generally operated at a line voltage of 230 V (between each line conductor and the neutral conductor) or 400 V (between the three line conductors), but in any case only up to 1000 V. Power ratings of individual local network transformers may vary depending on the target network planning of the respective distribution network operator, but typically lie in the region of 250 or 400 kVA for rural areas and 630 or 800 kVA for urban areas.

The term low-voltage network, within the meaning of the present invention, denotes a part of the electricity distribution grid, i.e., a section that is supplied with electrical energy by a specific local network transformer.

Components of the low-voltage network, and therefore network nodes, may be: electricity generators (e.g., photovoltaic systems, or small-scale wind turbines), accumulators (e.g., batteries, or heat pumps) such as charging stations for electric vehicles, flexible power-consuming loads (e.g., electric storage heaters, buildings/households with and without building automation system and corresponding actuators (converters or drive elements, converting electrical signals into mechanical motion or other physical variables (e.g., pressure or temperature)) and network operating resources (transformers, lines, safety cutouts, measuring instruments such as smart meters, or transformer tap changers).

What is understood by "structureless information" is the fact that the measurement data records contain no information relating to which physical (material) device of the network node has generated and sent a particular measurement data record, i.e., whether the device is, e.g., a transformer, an electricity-consuming load or a measuring instrument. The measurement data record merely contains an address, e.g., a number or letter combination (such as a device number), which is permanently assigned to a specific network node, but has no inherent meaning. Similarly, the measured values are transmitted only in the form of numbers without specification of physical entities, so that it is not apparent from the measurement data record per se which physical variable has been measured.

Today, traditional network operation faces major challenges due to the increasing penetration of the sector by decentralized, mostly renewable, energy generating plants (known in Germany as DEAs). This has been evidenced in the last several years by the trend toward intelligent networks, known as "smart grids", which are regarded as the solution to the afore-mentioned increasing challenge. These intelligent electricity supply networks serve among other things for the communicative networking and control of electricity generators, accumulators, electrical power-consuming loads and network operating resources in energy transmission and energy distribution networks of the electricity supply.

The automation of the low-voltage network increasingly desired by network operators creates a hugs challenge due to the very large number of network nodes that need to be automated and their different technical characteristics. Connecting network nodes that are relevant to metering technology, such as measuring counters (smart meters) or power inverter stations, to data centers is demanding not only in terms of networking and communications technology. Rather, smart meters make only unstructured data available. Thus, the widely established International Electrotechnical Commission (IEC) 60870-5-104 protocol, for instance, provides only very limited meta information relating to the object that is to be transmitted, such as the data type, but not more detailed parameters of interest for processing the data, such as physical entity, type of measurement sensor, geographical origin, or network section. More recent protocols, such as IEC 61850, sometimes offer a significantly higher degree of structuring of the data. Very long lifecycles and high costs of the objects to be transmitted in some cases mean that a quick solution to the missing meta information by replacing the objects with better equipped objects is unlikely.

The conventional approach to identifying network nodes in a higher-level system (referred to as a head-end system) is based on manual evaluation. A head-end system in this case generally comprises hardware and software that receive a stream of measurement data from measuring instruments of a measurement infrastructure (e.g., from an advanced metering infrastructure (AMI)). Head-end systems can perform a limited number of data evaluations before making the data available to other systems, in manual evaluations, an engineer makes a static assignment of the network node to a more comprehensive structured element of a higher-level system. Thus, for instance, a structureless address is assigned a specific meaning, e.g., "transformer tap position", which now makes a unique assessment concerning the type of device, the entity to which the network node is assigned, and the meaning within the low-voltage network. This approach has a number of real disadvantages.

Firstly, the engineer is required to have knowledge of the internal data structure of the network node, i.e., knowledge of all of the network nodes, which is hardly possible in the case of a large number of network nodes.

Secondly, the assignment is usually static and can be changed only with difficulty during the operation of the low-voltage network.

Thirdly, the deployment of new network nodes or changes to existing network structures must be brought to the attention of the engineer.

The third point in particular contradicts the requirement of organizing the transition of traditional networks to intelligent "smart grids" with a minimum of configuration overhead. Manual engineering is extremely problematic, especially in the low-voltage network, because here the numbers of network nodes present are orders of magnitude greater than at the next-higher network level.

SUMMARY OF THE INVENTION

In view of the foregoing, it is an object of the invention to provide a method by which meanings may be assigned to measurement data at least in part without human assistance, i.e., the structuring of the measurement data may be organized at least partially in a configuration-free manner.

This and other objects and advantages are achieved in accordance with the invention by a method in which incoming measurement data records, in particular asynchronously arriving measurement data records, from a plurality of network nodes are each stored in a data memory in a time sequence for each network node, time sequences are subjected to a mathematical analysis via automatic data processing, and the result of the analysis is appended to a measurement data record in the form of at least one semantic comment.

Accordingly, an automatic annotation of the measurement data is performed, without manual engineering on the part of an engineer. As a result, existing devices (network nodes), in particular metering points and actuators such as controllable transformers or inverters, can be integrated into an intelligent electricity supply network without additional configuration or engineering overhead. In most cases, the results of the automatic annotation will in fact be less precise or more general than those obtained by manual engineering. However, for many applications, such as the representation of the low-voltage network in a control room, a reduced data precision is sufficient. The exact identity of a network node is of secondary interest in most cases. Of greater interest is the behavior of the network node, e.g., of a metering point, such as whether the voltage lies in a critical range or which network node usually causes problems in terms of voltage stability, and the relationship of the network nodes of the low-voltage network with one another.

When measurement data records arrive asynchronously, it means that they do not arrive at regular time intervals.

Furthermore, the measurement data records of different network nodes will not arrive in the data memory at the same time instants. Because the measurement data records are stored as a time sequence, it is easily possible to subsequently select that measurement data that accumulated in a specific time period to compare it with the measurement data of other series of measured values for the time period.

The apparatus for automated data enrichment, also referred to in the following as an annotation engine, may be implemented within the known automation architecture of low-voltage networks as an extension of the head-end system. A part of the annotation engine is a data memory that stores incoming measurement data in time sequences. Following a startup phase in which the measurement data records are initially collected, it is possible for the annotation engine to calculate from the time sequences, with an increasing confidence interval, significant information mainly of a statistical nature, which allows an enrichment of the measurement data records.

The enrichment of the data is realized through the generation of semantic comments, referred to, for instance, as tags, i.e., simple, descriptive expressions, as are also common in social networks on the internet. An arbitrary number of comments may be allocated in each case to each measurement data record, i.e., to each measured value and each network node.

It may therefore be provided that a comment contains an item of information indicating which type of network node is under consideration and/or which measurement variable is concerned in the measured value. Such an item of information is referred to in this context as structured information.

Possible mathematical analyses for the method in accordance with to the invention are explained hereinbelow.

In an embodiment, the mathematical analysis comprises averaging the measured values within a time sequence, in which case a comment is appended in the case of a typical already known average value to the effect that a particular type of network node and/or measured value is under consideration. In this context, the analysis is a statistical analysis by which the average value of the measured values is, e.g., constantly calculated to identify the physical entity of the network node. If, for instance, the average value amounts to "230", then the measured values will be voltage values and the network node a voltage meter. Each of the measured values of this time sequence may therefore be provided, for instance, with the comment "voltage value", and the network node with a comment "voltage meter".

The mathematical analysis may comprise a frequency analysis within a time sequence, in which case, if a typical time interval between two measurement data records of the network node is exceeded, a comment is appended to the effect that the network node has crashed. An unusually long absence of a measurement data record of a particular network node can result in a comment for the network node to the effect that the node has suffered a temporary failure.

The mathematical analysis may comprise a behavioral analysis within a time sequence, in which case, if a limited number of consistently identical numerical values are received as measured values of the network node, a comment is appended to the effect that the network node is a switch or tap changer. However, the tap changer could also be assigned to a transformer. If, therefore, only the same two numerical values for the measured value are only transmitted by a network node to the data memory, then a comment is generated for the network node to the effect that the node is a simple switch. If only the same three or more numerical values for the measured value are ever transmitted by a network node to the data memory, then a comment is generated for the network node to the effect that the node is a tap changer of a transformer.

The mathematical analysis may comprise a correlation analysis between a plurality of time sequences, in which case, in the event of successive changes to the measured values of different time sequences or network nodes, a comment is appended to the effect that the network nodes are electrically dependent on one another. Thus, if a switching operation of a first network node leads to a voltage jump at another network node, the other network node receives the comment "electrically dependent on network node No. . . . (address of the first network node)".

In this way a temporal correlation is also established in that a time-delayed reaction to the switching operation is observed at a plurality of different network nodes. In this respect, it may be provided that a comment is generated for that network node that experiences the first change to the measured value to the effect that it is a tap changer (or a transformer), whereas for the voltage-following network nodes experiencing later changes to the measured value, a comment is generated to the effect that these are embodied as measuring instruments in the same electrical network.

The correlation analysis may also deliver assessments concerning the local arrangement of network nodes. If the time sequences of the measured values are observed over a relatively long period of time, it is possible, based on the time-delayed reaction to switching operations, to estimate a geographical position of the individual network nodes or at least to indicate that they are located in the same network region, i.e., in the same network daisychain, for instance.

The mathematical analysis may comprise a failure analysis of a plurality of time sequences, in which case, in the event of simultaneous failure of a plurality of network nodes, i.e., if no measurement data records are received from these, a comment is generated to the effect that disconnection switches are present for the network nodes.

Finally, it is possible, via data processing programs capable of complex pattern recognition or curve fitting, or using complex nonlinear analysis methods (e.g., using neural networks), to determine a pattern or profile of a measured value curve (e.g., a voltage and/or power profile) and to perform a comparison with known patterns or profiles, such as a standard household profile "H0". If the patterns or profiles match, a comment is appended to the network node to the effect that the network node is a particular network node type, e.g., a household. In that respect it may be provided that the mathematical analysis comprises a pattern recognition within a time sequence, in which case, if the pattern of the time sequence of the network node under investigation coincides with already known patterns that correspond to a known type of network node, a comment is generated to the effect that the investigated network node is of a particular known type.

Generally, the comments can be provided with a confidence or a confidence interval. For each measurement data record, i.e., for each measured value and for each network node, it is of course possible in each case to assign an arbitrary number of comments, i.e., the comment can also be assigned a value indicating how high the precision of the comment is, in other words with what degree of certainty it is accurate.

It should be understood that it is not ruled out by the present invention that manual engineering will also continue to occur and that comments will continue to be generated and imported manually into the annotation engine, where the comments are then assigned a high, in particular the highest possible, confidence because, of course, they have been validated by an engineer. The manual annotation will be particularly beneficial for critical network nodes. For example, it could be specified manually which network node is a transformer, i.e., the root of the low-voltage network. As a result, the confidence in the automatically generated judgment (i.e., in the automatically generated comment) that the other network nodes (in particular network nodes electrically dependent on one another) are likely to be smart meters, would be increased. In this regard, it may be provided that in the event of manual specification of a confidence or a confidence interval for a comment relating to a network node, the confidence or the confidence interval of automatically generated comments relating to other network nodes will be increased.

It is also an object of the present invention to provide a computer program product which comprises a program and can be loaded directly into a memory of a central computer of a low-voltage network and which has program means for implementing all steps of the method in accordance with the invention when the program is executed by the central computer.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In order to explain the invention in more detail, reference is made in the following part of the description to the figures, from which further advantageous details and potential areas of application of the invention will become apparent, in which:

FIG. 3 is a flowchart of the method in accordance with the invention.

DETAILED DESCRIPTION OF THE EXEMPLARY EMBODIMENTS

Figure 1:
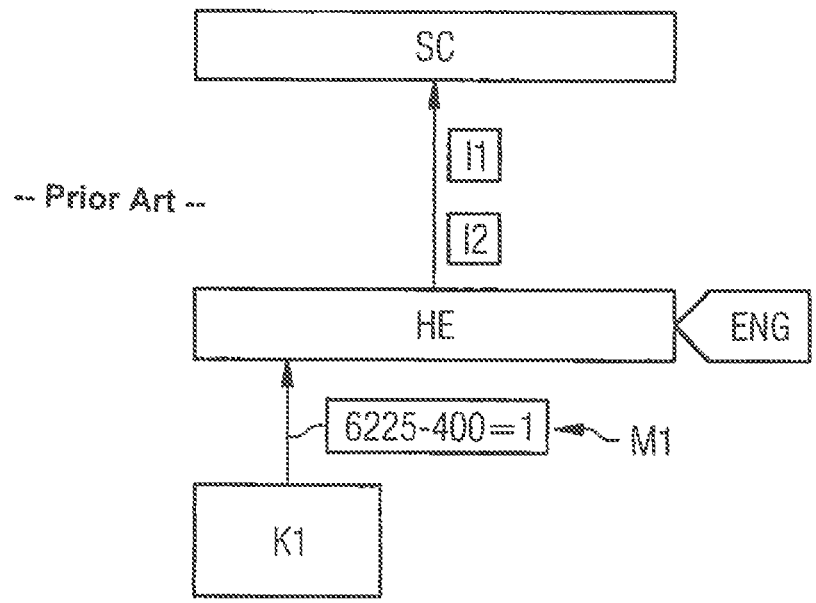
FIG. 1 shows a schematic representation of the method execution sequence for data enrichment in accordance with the prior art.

FIG. 1 shows an overview of an execution sequence in accordance with the prior art the prior art, which is applied to a low-voltage network having, in this case, just one illustrated network node K1. The network node K1 sends a measurement data record M1 consisting of the unstructured information "6225-400=1" to the head-end system HE, which serves as a sort of "data concentrator". The measurement data record M1 therefore consists of a structureless address "6225-400", which has no meaning in terms of content, and the measured value "1", for which likewise no meaning, i.e., no physical entity, is sent as accompaniment. It is now recognized by manual intervention ENG on the part of an engineer at the head-end system HE that "6225-400" relates to a specific transformer, e.g., transformer1, and that the measured value "1" represents the current tap changer position of the transformer. As a result of manual intervention ENG, the measurement data record is now converted into two items of structured information I1, I2, where information I1 reads "transformer1" and information I2 reads "tap changer position=1". Now, only the two items of information I1, I2 are transmitted by the head-end system HE to the higher-level control and monitoring system SC, but not the original measurement data record M1 or the structureless address "6225-400". The higher-level control and monitoring system SC is usually designated by Supervisory Control and Data Acquisition (SCADA), by which is understood the monitoring and control of technical processes via a computer system.

Figure 2:
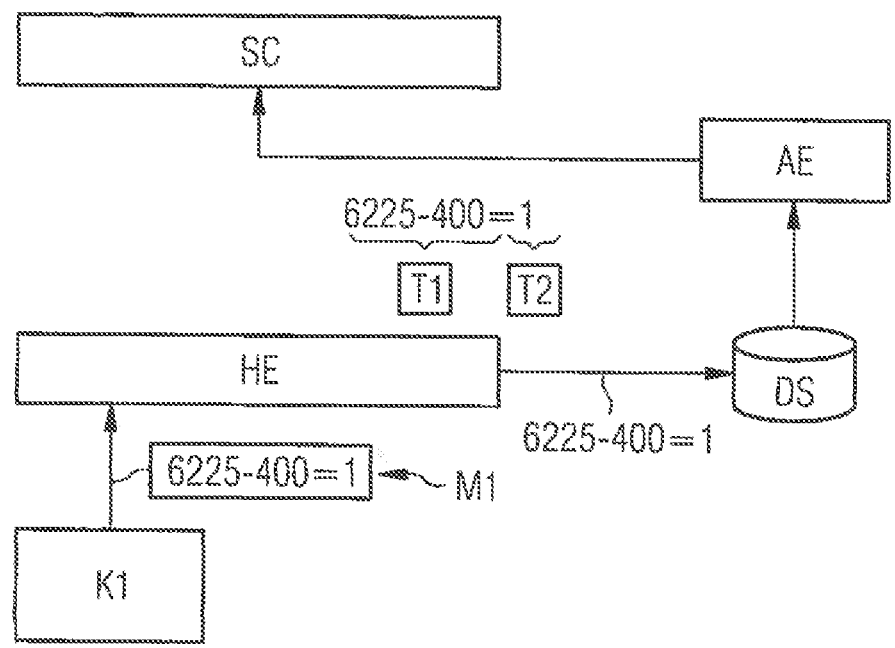
FIG. 2 shows a schematic representation of the method execution sequence for data enrichment in accordance with the invention.

In the method in accordance with the invention as shown in FIG. 2, likewise, the network node K1 (the large number of other network nodes are not depicted here) sends a measurement data record M1 consisting of the information "6225-400=1" to the head-end system HE, which again serves as a "data concentrator". Now, however, no manual analysis of the measurement data record occurs but, instead, the measurement data record is forwarded to a data memory DS, where a separate time sequence is created for each network node K1, i.e., for each unstructured address (e.g., for "6225-400"), i.e., the measurement data records are stored together with the information relating to the time of arrival in the head-end system HE or in the data memory DS. The data of the data memory DS is now supplied to the annotation engine AE, which subjects the time sequences to a mathematical analysis via automatic data processing. In the case shown, the annotation engine AE therefore recognizes that previously the address "6225-400" has only ever delivered a limited number of low integer positive values, which implies that the current measured value "1" probably represents a tap changer position.

From this, it follows that the network node "6225-400" is a transformer (or, more specifically, its tap changer, if it is wished to make this distinction).

The annotation engine AE accordingly generates two comments or tags T1, T2, where the first tag T1 contains the word "transformer" and is appended to the address "6225-400" in the measurement data record M1, and the second tag T2 contains the words "tap changer position" and is appended to the measured value "1" in the measurement data record M1.

Subsequently, the measurement data record M1, i.e. "6225-400=1", is transmitted together with the two comments or tags T1, T2 by the annotation engine AE to the higher-level control and monitoring system SC and is also stored in the annotation engine AE.

FIG. 3 is a flowchart of a method for enriching data of measurement data records M1 of a low-voltage network, where a measurement data record contains at least one measured value and an item of structureless information relating to a network node K from which the data record originates.

The method comprises storing incoming measurement data records M1 arriving asynchronously from a plurality of network nodes K1 within a data memory DS in a time sequence for each network node K1, as indicated in step 310.

Next, time sequences are subject to a mathematical analysis via automatic data processing, as indicated in step 320.

A result of the analysis is now appended to a measurement data record as at least one semantic comment T1, T2, as indicated in step 330.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A method for enriching data of measurement data records of a low-voltage network, a measurement data record containing at least one measured value and an item of structureless information relating to a network node from which the data record originates, the method comprising:
   storing incoming measurement data records arriving asynchronously from a plurality of network nodes within a data memory in a time sequence for each network node;
   subjecting time sequences to a mathematical analysis via automatic data processing; and
   appending a result of the analysis to a measurement data record as at least one semantic comment to automatically annotate the data of the measurement data records with a tag indicating a type of network node within the low-voltage network which permits integration of the network node into an intelligent electricity supply network without additional configuration or engineering overhead.

2. The method as claimed in claim 1, wherein the at least one semantic comment contains an item of information indicating which type of network node is under consideration.

3. The method as claimed in claim 1, wherein the at least one semantic comment contains an item of information indicating which measurement variable is concerned in the at least one measured value.

4. The method as claimed in claim 2, wherein the at least one semantic comment contains an item of information indicating which measurement variable is concerned in the at least one measured value.

5. The method as claimed in claim 1, wherein the mathematical analysis comprises averaging measured values within the time sequence; and wherein in cases of a typical already known average value the at least one comment is appended such that at least one of (i) a particular type of network node and (ii) at least one measured value is under consideration.

6. The method as claimed in claim 1, wherein the mathematical analysis comprises a frequency analysis within a time sequence; and wherein if a typical time interval between two measurement data records of the network node is exceeded, then the at least one comment is appended to indicate the network node has crashed.

7. The method as claimed in claim 1, wherein the mathematical analysis comprises a behavioral analysis within the time sequence; and wherein if a limited number of consistently identical numerical values are received as measured values of the network node, then the at least one comment is appended to indicate the network node is a switch or tap changer.

8. The method as claimed in claim 1, wherein the mathematical analysis comprises a correlation analysis between a plurality of time sequences; and wherein in an event of successive changes to measured values of different time sequences or network nodes, the at least one comment is appended to indicate the network nodes are electrically dependent on one another.

9. The method as claimed in claim 8, wherein for that network node which experiences a first change, a comment is generated to indicate this network node is a tap changer, whereas for network nodes experiencing later changes, the at least one comment is generated to indicate the network nodes experiencing later changes comprise measuring instruments.

10. The method as claimed in claim 1, wherein the mathematical analysis comprises a failure analysis of a plurality of time sequences; and wherein in the event of simultaneous failure of a plurality of network nodes, the at least one comment is generated to indicate disconnection switches are present for said plurality of network nodes.

11. The method as claimed in claim 1, wherein the mathematical analysis comprises a pattern recognition within the time sequence; and wherein if a pattern of the time sequence of a network node under investigation coincides with already known patterns that correspond to a known type of network node, then the at least one comment is generated to indicate the network node under investigation is of a particular known type.

12. The method as claimed in claim 1, further comprising: providing comments with a confidence or a confidence interval.

13. The method as claimed in claim 1, wherein in an event of manual specification of a confidence or a confidence interval for a comment relating to a network node, the confidence or the confidence interval of automatically generated comments relating to other network nodes is increased.

14. A computer program product comprising a computer program loaded directly into memory of a central computer of a low-voltage network which, when executed by the central computer causes enrichment of data of measurement data records of the low-voltage network, the computer program comprising:
  program code for storing incoming measurement data records arriving asynchronously from a plurality of network nodes within a data memory in a time sequence for each network node;
  program code for subjecting time sequences to a mathematical analysis via automatic data processing; and
  program code for appending a result of the analysis to a measurement data record as at least one semantic comment to automatically annotate the data of the measurement data records with a tag indicating a type of network node within the low-voltage network which permits integration of the network node into an intelligent electricity supply network without additional configuration or engineering overhead.

* * * * *